United States Patent [19]
Juds et al.

[11] Patent Number: 6,130,599
[45] Date of Patent: Oct. 10, 2000

[54] ELECTRICAL CURRENT SENSING APPARATUS

[75] Inventors: Mark Allan Juds, New Berlin; Kurt Von Eckroth, Oconomowoc; Charles Joseph Tennies, Waukesha; James Edward Hansen, Oak Creek; Mark George Solveson, Oconomowoc; Jerome Kenneth Hastings, Sussex; Scott Reid, Brookfield, all of Wis.

[73] Assignee: Eaton Corporation, Cleveland, Ohio

[21] Appl. No.: 09/368,051

[22] Filed: Aug. 3, 1999

[51] Int. Cl.⁷ ...................................................... H01L 43/00
[52] U.S. Cl. ...................... 338/32 H; 338/32 R; 324/126
[58] Field of Search .................... 324/126, 251, 324/260, 261; 338/32 H, 13, 32 R, 49; 257/421, 422

[56] References Cited

U.S. PATENT DOCUMENTS

| | | | |
|---|---|---|---|
| 3,234,461 | 2/1966 | Trent et al. | 324/127 |
| 3,335,383 | 8/1967 | Jordan | 338/32 R |
| 4,182,982 | 1/1980 | Wolf et al. | 324/126 |
| 4,496,932 | 1/1985 | Halder | 338/49 |
| 4,506,214 | 3/1985 | Lienhard et al. | 324/127 |
| 4,559,495 | 12/1985 | Lienhard | 324/127 |
| 4,580,095 | 4/1986 | De Vries | 324/126 |
| 4,587,509 | 5/1986 | Pitt et al. | |
| 4,616,207 | 10/1986 | Knapp, Jr. et al. | |
| 4,749,940 | 6/1988 | Bullock | 324/127 |
| 4,794,326 | 12/1988 | Friedl | 324/117 R |
| 5,027,059 | 6/1991 | Montgolfier et al. | 324/127 |
| 5,587,652 | 12/1996 | Berkcan et al. | 324/127 |
| 5,917,401 | 6/1999 | Smith et al. | 338/49 |

*Primary Examiner*—Karl D. Easthom
*Attorney, Agent, or Firm*—Tarolli, Sundheim, Covell, Tummino & Szabo L.L.P.

[57] ABSTRACT

An electrical sensing apparatus includes a conductor having longitudinally extending sections with parallel central axes and a connector section which extends between the longitudinally extending sections. The connector section has a central axis which extends parallel to the central axes of the longitudinally extending sections. A magnetic flux sensor is disposed adjacent to the connector section to detect variations in current conducted through the conductor. The magnetic flux sensor may be at least partially disposed in a slot in the connector section and have a flux sensitive side surface which extends perpendicular to a central axis of the connector section. The magnetic flux sensor may include an electrically insulating material which is at least partially enclosed by the connector section and a Hall effect device which is supported by the electrically insulating material. The electrically insulating material may be disposed in engagement with the connector section.

9 Claims, 3 Drawing Sheets

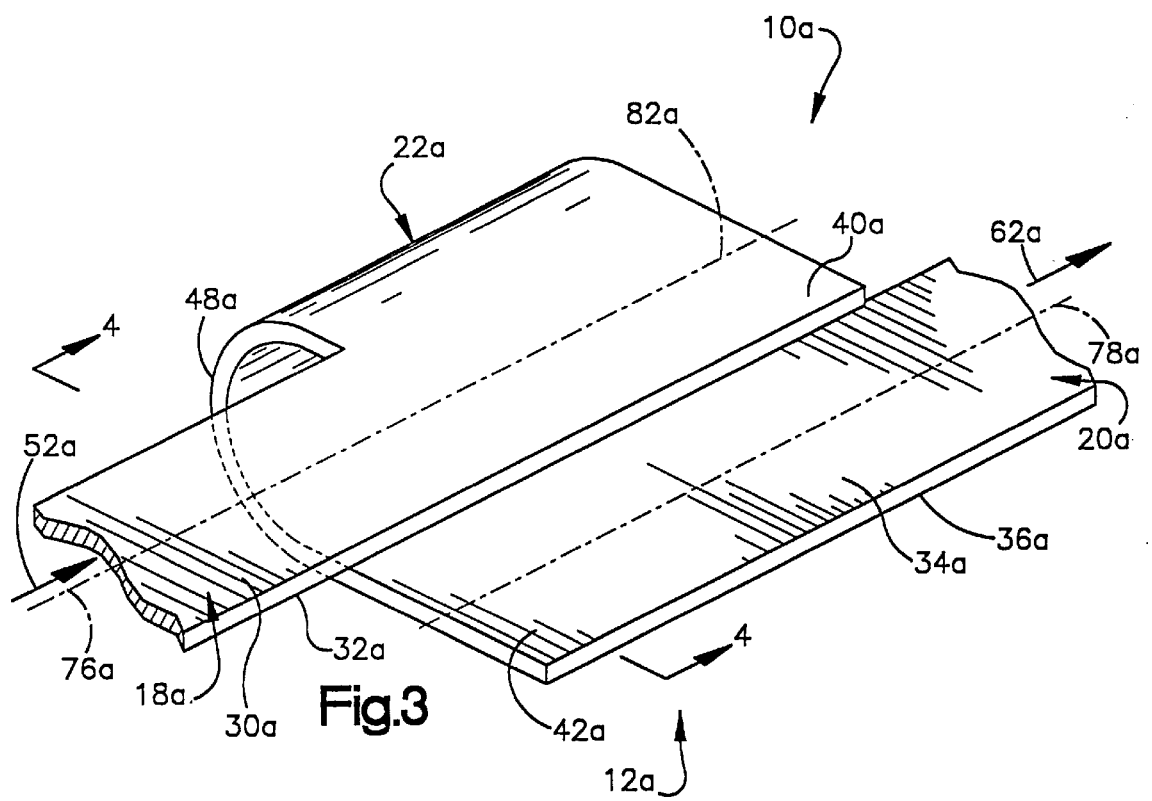
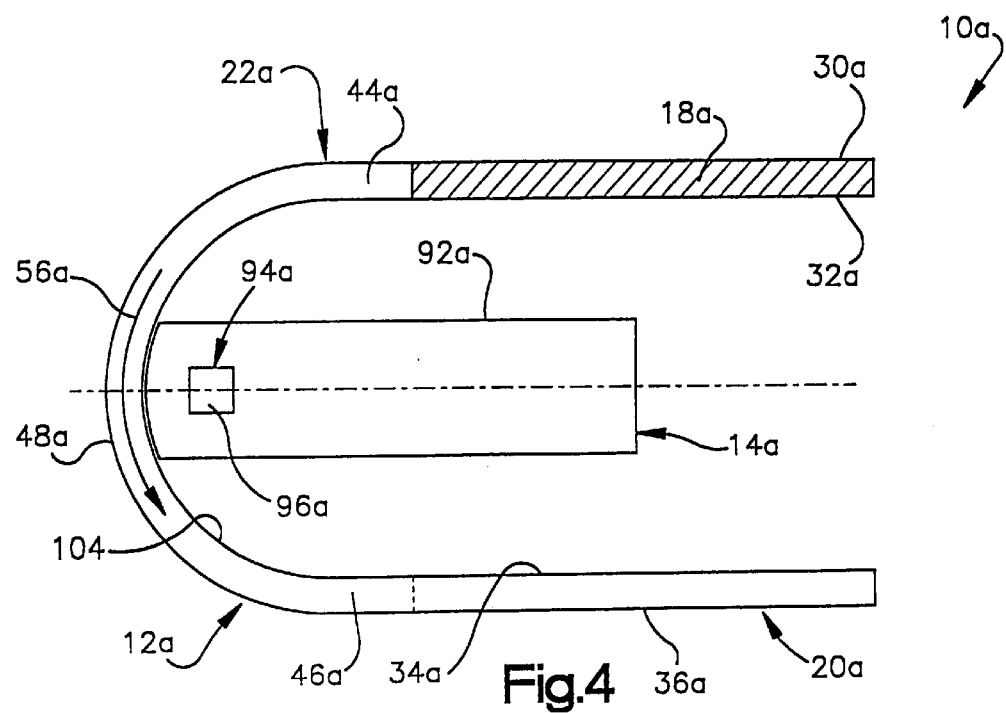

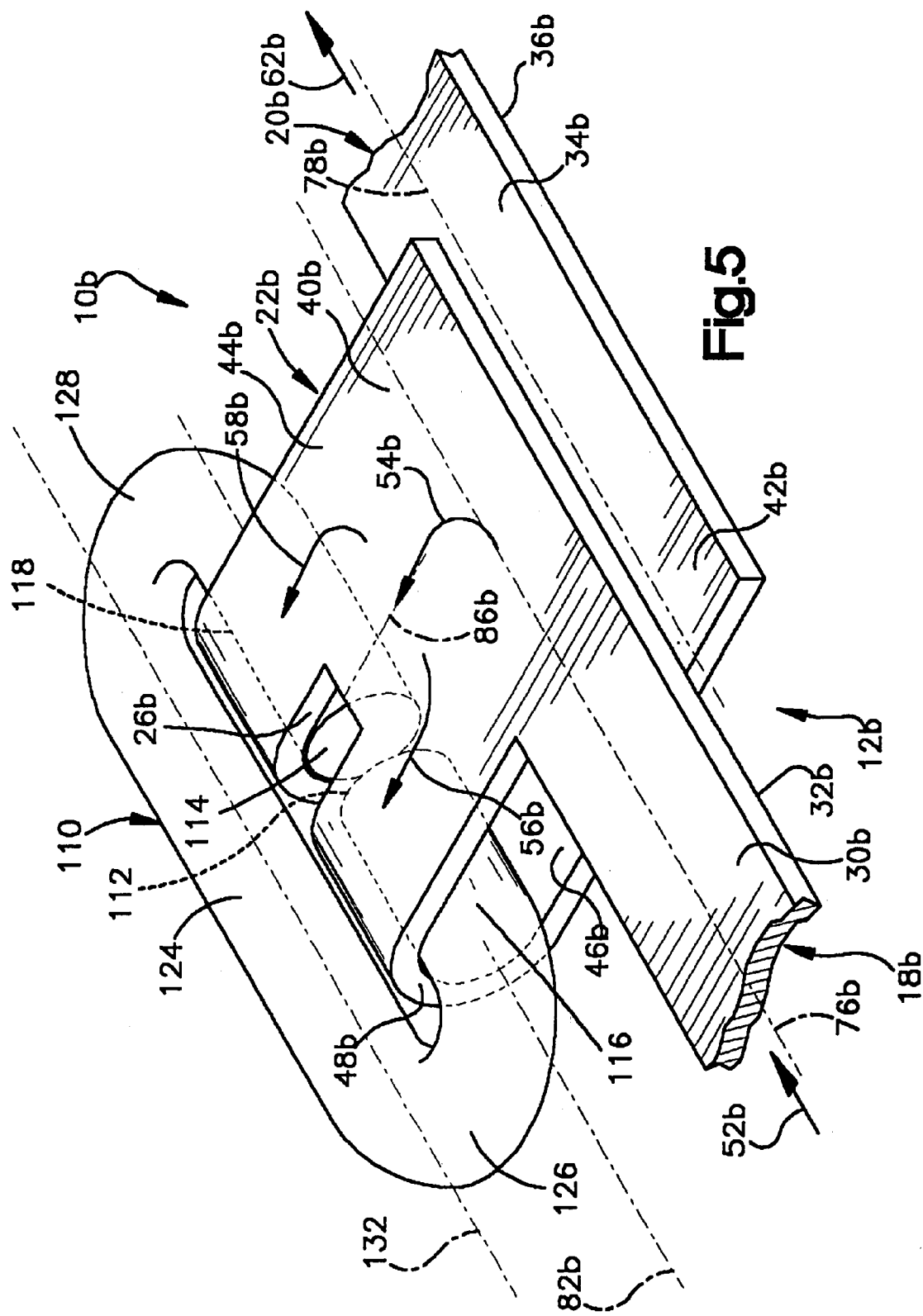

ELECTRICAL CURRENT SENSING APPARATUS

BACKGROUND OF THE INVENTION

The present invention relates to an apparatus which senses an electrical current in a conductor and includes a magnetic flux sensor.

Hall effect devices have been used to sense variations in magnetic flux resulting from a flow of current through a conductor. Some of these known devices have used a flux concentrator to concentrate magnetic flux emanating from the flow of current through the conductor. It has previously been suggested that electrical current sensing apparatus could be constructed in the manner disclosed in U.S. Pat. Nos. 4,587,509 and 4,616,207.

SUMMARY OF THE INVENTION

The present invention provides an electrical current sensing apparatus which includes an electrical current conductor having a connector section which extends between longitudinally extending sections of the conductor. A magnetic flux sensor is disposed adjacent to the connector section. The magnetic flux sensor may include a support formed of electrically insulating material and a magnetic flux responsive device, such as a Hall effect device.

The connector section may have a central axis which extends parallel to central axes of the longitudinally extending sections of the conductor. The Hall effect device may have a flux sensitive surface which extends perpendicular to the central axis of the connector section. In one embodiment of the invention, the magnetic flux sensor is at least partially disposed in an opening formed in the connector section. In another embodiment of the invention, the magnetic flux sensor is disposed in engagement with an inner surface of the connector section.

BRIEF DESCRIPTION OF THE DRAWINGS

The foregoing and other objects and features of the present invention will become more apparent upon a consideration of the following description taken in connection with the accompanying drawings wherein:

FIG. 3 is a simplified schematic pictorial illustration of a second embodiment of the electrical current sensing apparatus, a magnetic flux sensor being omitted for purposes of clarity of illustration;

FIG. 4 is an end view, taken generally along the line 4—4 of FIG. 3 illustrating the relationship of a magnetic flux sensor to the conductor; and FIG. 5 is a simplified schematic pictorial illustration, generally similar to FIG. 1, of another embodiment of the electrical current sensing apparatus, a magnetic flux sensor being omitted for purposes of clarity of illustration.

DESCRIPTION OF SPECIFIC PREFERRED EMBODIMENTS OF THE INVENTION

Figures 1, 2:
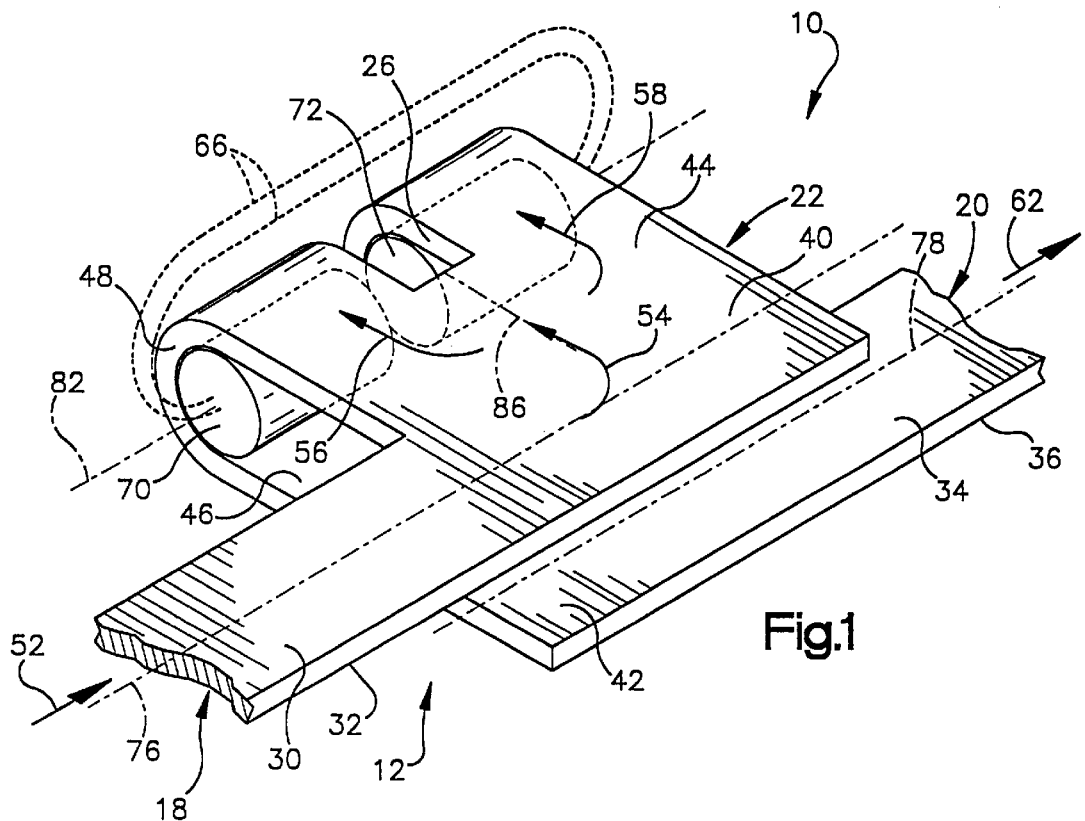
FIG. 1 is a simplified schematic pictorial illustration of an electrical current sensing apparatus constructed in accordance with the present invention, a magnetic flux sensor being omitted in FIG. 1 for purposes of clarity of illustration.
FIG. 2 is a top plan view of the electrical current sensing apparatus of FIG. 1 with a magnetic flux sensor positioned relative to the conductor.

An electrical current sensing apparatus 10, constructed in accordance with the present invention, is illustrated in FIGS. 1 and 2. The electrical current sensing apparatus 10 includes a conductor 12 and a magnetic flux sensor 14 (FIG. 2). The magnetic flux sensor 14 has been omitted in FIG. 1 in order to illustrate the manner in which magnetic flux is concentrated in an area where the magnetic flux sensor is positioned (FIG. 2).

The conductor 12 includes longitudinally extending sections 18 and 20 which extend in opposite directions from a connector section 22. The connector section 22 enables the magnetic flux sensor 14 to be positioned at a location where exposure of the magnetic flux sensor to a magnetic flux field emanating from the conductor 12 is maximized. The connector section 22 concentrates magnetic flux in an area where the flux sensor 14 is located.

The longitudinally extending section 18 extends toward the left (as viewed in FIGS. 1 and 2) from the connector section 22. The longitudinally extending section 20 extends toward the right from the connector section 22. Although the longitudinally extending sections 18 and 20 are illustrated as extending in opposite directions from the connector section 22, it is contemplated that the longitudinally extending sections 18 and 20 could extend in the same direction from the connector section 22 if desired.

The longitudinally extending sections 18 and 20 and connector section 22 are integrally formed as one piece of electrically conductive material, that is, a metal such as copper. It is contemplated that the longitudinally extending sections 18 and 20 and connector section 22 could be stamped from a single flat piece of sheet metal and then bent to the configuration illustrated in FIGS. 1 and 2. Of course, the longitudinally extending sections 18 and 20 and connector section 22 of the conductor 12 could be formed in a different manner if desired. It should be understood that the longitudinally extending sections 18 and 20 could have a different configuration. For example, the longitudinally extending sections 18 and 20 could have a cylindrical configuration if desired.

In the embodiment of the invention illustrated in FIGS. 1 and 2, the magnetic flux sensor 14 is received in an opening 26 formed in the connector section 22. The illustrated opening 26 is formed as a slot which extends completely through the connector section. The illustrated opening 26 has a rectangular configuration. However, it is contemplated that the opening 26 could have a different configuration if desired.

The left (as viewed in FIGS. 1 and 2) longitudinally extending section 18 of the conductor 12 has flat parallel upper and lower major side surfaces 30 and 32. Similarly, the right (as viewed in FIGS. 1 and 2) longitudinally extending section 20 has flat parallel upper and lower major side surfaces 34 and 36. The major side surfaces 30 and 32 of the left longitudinally extending section 18 of the conductor 12 extend parallel to and are vertically offset from the major side surfaces 34 and 36 of the right longitudinally extending section 20. Although the major side surfaces 30, 32, 34 and 36 of the longitudinally extending sections 18 and 20 of the conductor 12 are parallel to each other in the illustrated embodiment of the invention, it is contemplated that the major side surfaces, could, if desired, be skewed relative to each other.

In the embodiment of the invention illustrated in FIGS. 1 and 2, the lower major side surface 32 of the left longitudinally extending section 18 extends parallel to and is spaced apart from the upper major side surface 34 of the right longitudinally extending section 20. However, it is contemplated that the major side surfaces 32 and 34 of the left and right longitudinally extending sections 18 and 20 of the conductor 12 could be positioned in engagement with each other. Alternatively, a layer or thin coating of electrically insulating material could be provided between the major side surfaces 32 and 34 of the left and right longitudinally extending sections 18 and 20 of the conductor 12.

It is also contemplated that the connector section 22 and the left and right longitudinally extending sections 18 and 20 of conductor 12 could be configured so that the upper major side surface 30 of the left longitudinally extending section 18 is disposed in a coplanar relationship with the upper side surface 34 of the right longitudinally extending section 20. Of course, with such a construction, the lower major side surfaces 32 and 36 of the left and right longitudinally extending sections 18 and 20 would also be disposed in a coplanar relationship.

The connector section 22 extends from an end portion 40 of the left longitudinally extending section 18 and an end portion 42 of the right longitudinally extending section 20. The connector section 22 includes a pair of parallel arm sections 44 and 46. The arm sections 44 and 46 of the connector section 22 are interconnected by a bend section 48. The bend section 48 concentrates magnetic flux in the space enclosed by the bend section.

In the embodiment of the invention illustrated in FIGS. 1 and 2, the arm sections are formed with major side surfaces which are extensions of major side surfaces of the left and right longitudinally extending sections 18 and 20 of the conductor 12. Thus, the upper (as viewed in FIGS. 1 and 2) arm section 44 has an upper major side surface which is an extension of the upper major side surface 30 and a lower major side surface which is an extension of the lower major side surface 32 of the left longitudinally extending section 18. Similarly, the arm section 46 has an upper side surface which is an extension of the upper major side surface 34 and a lower major side surface which is an extension of the lower major side surface 36 of the right longitudinally extending section 20.

The connector section 22 may be formed separately from the longitudinally extending sections 18 and 20. If this is done, one end of the connector section 22 would be connected to the left longitudinally extending section 18. The opposite end of the connector section 22 would be connected to the right longitudinally extending section 20. This construction would be particularly advantageous if the left and right longitudinally extending sections 18 and 20 are formed by two pieces of cable.

In the illustrated embodiment of the invention, the arm sections 44 and 46 of the connector section 22 extend parallel to each other. However, it is contemplated that the arm sections 44 and 46 could be skewed either toward or away from each other. In order to provide for the parallel arm sections 44 and 46 illustrated in FIGS. 1 and 2, the bend section 48 has an arcuate configuration and extends through 180°. The arm sections 44 and 46 extend longitudinally to the bend section 48. However, it is contemplated that the bend section 48 could extend through a greater arcuate distance than 180°. If this was done, the parallel arm sections 44 and 46 would be connected with the bend section 48 at additional bends which would extend parallel to the bend section 48.

For example, it is contemplated that the lower major side surface of the upper arm section 44 and the upper major side section of the lower arm section 46 could be placed in abutting engagement with each other. A thin layer of insulating material could be provided between the arm sections 44 and 46 if desired. If this is done, the bend section 48 would have an extent of approximately 360°.

Alternatively, the bend section 48 could be formed with an arcuate extent of less than 180°. The arm sections 44 and 46 would flare outward away from the bend section 48. If the bend section 48 is formed with a reduced arcuate extent, slight bends could be formed at the junction between the arm sections 44 and 46 and the left and right longitudinally extending sections 18 and 20. The major side surfaces 30 and 32 of the left longitudinally extending section 18 would be parallel to the major side surfaces 34 and 36 of the right longitudinally extending section 20. However, it is believed that it will be preferred to form the bend section 48 with an arcuate extent of at least 180° to promote concentration of magnetic flux inside the bend section.

Electrical current is conducted through the left longitudinally extending section 18 to the connector section 22. The flow of electrical current through the left longitudinally extending section 18 is indicated schematically by an arrow 52 in FIGS. 1 and 2. The electrical current flows from the end portion 40 of the left longitudinally extending section 18 into the upper arm section 44 of the connector section 22 in the manner indicated by an arrow 54 in FIG. 1. The electrical current flows from the upper arm section 44 along opposite sides of the opening 26, in the manner indicated by the arrows 56 and 58 in FIG. 1.

The electrical current then flows around the bend section 48 and into the lower arm section 46 of the connector section 22. The electrical current flows from the arm section 46 of the connector section 22 into the end portion 42 of the right longitudinally extending section 20 of the conductor 12. The electrical current then flows through the right longitudinally extending section 20 of the conductor 12 in a direction away from the connector section 22 in the manner indicated by arrows 62 in FIGS. 1 and 2.

As the electrical current flows through the connector section 22, magnetic flux, indicated schematically by dashed lines at 66 in FIG. 1, becomes concentrated in the space disposed on the inside of the bend section 48 of the connector section 22. The magnetic flux is concentrated by reducing the radius of the connector section 22.

To further promote the concentration of magnetic flux at the inside of the bend section 48, a pair of magnetic members 70 and 72 are positioned in and at least partially enclosed by the bend section 48. In the illustrated embodiment of the invention, the magnetic members 70 and 72 have a cylindrical configuration. The radius of curvature of the inside of the bend section 48 is the same as the radius of curvature of the cylindrical outer side surfaces of the magnetic members 70 and 72. The magnetic members 70 and 72 may be formed of iron or similar material having a relatively high magnetic permeability.

The left and right longitudinally extending sections 18 and 20 of the conductor 12 have parallel central axes 76 and 78. The parallel central axes 76 and 78 of the left and right longitudinally extending sections 18 and 20 are both disposed in a plane which extends perpendicular to the major side surfaces 30, 32, 34 and 36 of the left and right longitudinally extending sections. A central axis 82 of the connector section 22 extends parallel to the central axes 76 and 78 of the longitudinally extending sections 18 and 20.

The central axis 82 of the connector section 22 extends through the center of curvature of the bend section 48 and through the magnetic members 70 and 72 and is coincident with central axes of the magnetic members.

The opening 26 has a central axis 86 which extends around the bend section 48 and extends perpendicular to and intersects the central axes 76 and 78 of the left and right longitudinally extending sections 18 and 20. The central axis 86 of the opening 26 has parallel linear segments which are interconnected by an arcuate bend segment. The bend segment of the central axis 86 of the opening 26 has a center of curvature disposed on the axis 82.

Although it is contemplated that the electrical current sensing apparatus 10 could be constructed in many different ways, in the illustrated embodiment of the invention, the electrical current sensing apparatus is constructed by stamping the longitudinally extending sections 18 and 20 and connector section 22 from a flat sheet of material and subsequently forming the connector section in a reverse bend to the shape illustrated in the drawings.

Although it is contemplated that it may be preferred to form the electrical current sensing apparatus 10 in this manner, it should be understood that the electrical current sensing apparatus could be formed in a different manner if desired. For example, the bend section 48 could have a rectangular configuration rather than an arcuate configuration. If this is done, the magnetic members 70 and 72 may also be formed with a rectangular configuration.

Although it is preferred to use the magnetic members 70 and 72 to promote concentration of the flux 66 at the bend section 48, the magnetic members 70 and 72 may be omitted if desired. If the magnetic members 70 and 72 are omitted, the bend section 48 would, itself, promote the concentration of the flux 66 emanating from the electrical current conducted through the connector section 22. The bend section 48 causes the magnetic flux to become concentrated on the inside of the bend section. The concentration of flux is inversely proportional to the radius of the bend section. An optimum radius is one-half the dimension of the flux sensitive area of the Hall effect device, and the concentration occurs on the axis 82.

The flux sensitive area of the flux sensor 14 and bend section 48 may have many different dimensions. In one specific instance, the flux sensitive area of the flux sensor 14 has a diameter of 0.060 inches and the bend section 48 had an inside radius of approximately 0.030 inches. However, it is contemplated that the flux sensor 14 could have a diameter of 0.005 inches and the bend section 48 could have an inside radius of 0.0025 inches. Of course, if the flux sensitive area of the flux sensor 14 is larger, the bend section 48 would have a larger radius.

The magnetic flux sensor 14 is advantageously positioned in the opening 26 (FIG. 2). The magnetic flux sensor 14 includes a support structure 92 formed of an electrically insulating material. A magnetic flux responsive device 94 is held by the support structure 92 in the manner indicated schematically in FIG. 2. In the illustrated embodiment of the invention, the magnetic flux responsive device 94 is a Hall effect device. However, other known magnetic flux responsive devices could be utilized if desired.

The support structure 92 positions the Hall effect device 94 between circular end surfaces on the magnetic members 70 and 72. The coincident central axes 82 of the bend section 48 and the magnetic members 70 and 72 extend through the center of the Hall effect device 94. A flux sensitive side surface 96 on the Hall effect device 94 extends perpendicular to and is intersected by the central axis 82 of the bend section 48. As was previously mentioned, the central axis 82 of the bend section 48 is coincident with the central axes of the magnetic members 70 and 72.

It should be understood that the Hall effect device 94 could be supported in the opening 26 in a different manner if desired. For example, the Hall effect device 94 could be supported by either or both of the magnetic members 70 and 72 if desired. Alternatively, the Hall effect device 94 could be supported by engagement of a support bracket with the connector section 22.

The Hall effect device 94 is connected with suitable control circuitry (not shown). The output from the Hall effect device 94 varies as a function of variations in the strength of the magnetic flux 66 conducted through the Hall effect device 94. Of course, the strength of the magnetic flux 66 conducted through the Hall effect device 94 will vary as a function of the flow of current through the conductor 12. Therefore, the output from the Hall effect device 94 will vary as a function of variations in the current conducted through the conductor 12. This enables the control circuitry connected with the Hall effect device 94 to initiate a suitable control function in the event of variations in the rate of flow of current through the conductor 12.

In the embodiment of the invention illustrated in FIGS. 1 and 2, an opening 26 is provided in the connector section 22 to receive the magnetic flux sensor 14 (FIG. 2). In the embodiment of the invention illustrated in FIGS. 3 and 4, the connector section is free of openings. Since the embodiment of the invention illustrated in FIGS. 3 and 4 has the same general construction as the embodiment of the invention illustrated in FIGS. 1 and 2, similar numerals will be utilized to designate similar components, the suffix letter "a" being associated with the numerals of FIGS. 3 and 4 to avoid confusion.

An electrical current sensing apparatus 10a (FIGS. 3 and 4) includes a conductor 12a. The conductor 12a includes longitudinally extending sections 18a and 20a (FIG. 3). A connector section 22a extends between the left and right longitudinally extending sections 18a and 20a. The connector section 22a is integrally formed as one piece with the longitudinally extending sections 18a and 20a. However, the connector section 22a and longitudinally extending sections 18a and 20a could be formed separately and then interconnected.

The left longitudinally extending section 18a includes flat parallel upper and lower major side surfaces 30a and 32a. The right longitudinally extending section 20a includes flat parallel upper and lower major side surfaces 34a and 36a. The upper and lower major side surfaces 34a and 36a of the right longitudinally extending section 20a extend parallel to the major side surfaces 30a and 32a of the left longitudinally extending section 18a. End portions 40a and 42a (FIG. 3) of the left and right longitudinally extending sections 18a and 20a are connected with the connector section 22a.

The connector section 22a includes upper and lower arm sections 44a and 46a (FIG. 4) which are connected with a bend section 48a. Electrical current, indicated schematically at 52a in FIG. 3, is conducted through the left longitudinally extending section 18a to the connector section 22a. The electrical current flows through the bend section 48a of the connector section 22a, in the manner indicated schematically by an arrow 56a in FIG. 4. The electrical current flows away from the connector section 22a through the right longitudinally extending section 20a in the manner indicated by an arrow 62a in FIG. 3.

The left and right longitudinally extending sections 18a and 20a have parallel longitudinal central axes 76a and 78a (FIG. 3). Both of the axes 76a and 78a are disposed in a plane which extends perpendicular to the major side surfaces 30a, 32a, 34a and 36a of the left and right longitudinally extending sections 18a and 20a. A central axis 82a of the connector section 22a extends parallel to and is spaced equal distances from the central axes 76a and 78a of the longitudinally extending sections 18a and 20a of the conductor 12a. The axis 82a extends through the center of curvature of the bend section 48a.

In the embodiment of the invention illustrated in FIGS. 3 and 4, a magnetic flux sensor 14a is disposed within the connector section 22a and between the left and right longitudinally extending sections 18a and 20a of the conductor 12a (FIG. 4). The magnetic flux sensor 14a includes a support structure 92a and a magnetic flux responsive device 94a. In the specific embodiment of the invention illustrated in FIG. 4, the magnetic flux responsive device is a Hall effect device 94a. The Hall effect device 94a is supported by the support structure 92a with a flux sensitive side surface 96a of the Hall effect device 94a extending perpendicular to the central axis 82a (FIG. 3) of the connector section 22a and perpendicular to the central axes 76a and 78a of the longitudinally extending sections 18a and 20a.

In the embodiment of the invention illustrated in FIG. 4, the Hall effect device 94a is offset, toward the left (as viewed in FIG. 4) of the center of curvature of the bend section 48a. However, if desired, the support structure 92a could position the Hall effect device 94a so that the central axis 82a of the bend section 22a extends through the center of the Hall effect device 96a. In the embodiment of the invention illustrated in FIG. 4, the support structure 92a engages an inner side surface 104 of the arcuate bend section 48a to position the magnetic flux sensor 14a relative to the conductor 12a. However, If desired, the support structure could be spaced from the bend section 48a.

When the electrical current 56a flows around the bend section 48a, in the manner indicated schematically in FIG. 4, magnetic flux is concentrated in the area around the inside of the bend section 48a. By positioning the Hall effect device 94a inside the bend section 48a of the conductor 12a, the Hall effect device is positioned in the concentrated magnetic flux resulting from the electrical current 56a.

The Hall effect device 94a is connected with suitable control circuitry. Upon a variation in the electrical current 56a flowing through the conductor 12a, there is a corresponding variation in the output of the Hall effect device 94a. The control circuitry may initiate a suitable control function in response to a variation in the output from the Hall effect device 94a.

In the embodiment of the invention illustrated in FIGS. 1 and 2, magnetic members 70 and 72 are positioned inside of the bend section 48. In the embodiment of the invention illustrated in FIG. 5, the magnetic members are formed as one piece and extend around the outside of the bend section. Since the embodiment of the invention illustrated in FIG. 5 is generally similar to the embodiment of the invention illustrated in FIGS. 1 and 2, similar numerals will be utilized to designate similar components, the suffix letter "b" being associated with the numerals of FIG. 5 to avoid confusion.

An electrical current sensing apparatus 10b (FIG. 5) includes a conductor 12b. The conductor 12b includes longitudinally extending sections 18b and 20b. A connector section 22b extends between the left and right longitudinally extending sections 18b and 20b. The connector section 22b is integrally formed as one piece with the longitudinally extending sections 18b and 20b. However, the connector section 22b and longitudinally extending sections 18b and 20b could be formed separately and then interconnected.

The left longitudinally extending section 18b includes flat parallel upper major and lower side surfaces 30b and 32b.

The right longitudinally extending section 20b includes flat parallel upper major and lower side surfaces 34b and 36b. The upper and lower major side surfaces 34b and 36b of the right longitudinally extending section 20b extend parallel to the major side surfaces 30b and 32b of the left longitudinally extending section 18b. End portions 40b and 42b of the left and right longitudinally extending sections 18b and 20b are connected with the connector section 22b. Upper and lower arm sections 44b and 46b are connected with a bend section 48b.

Electrical current, indicated schematically at 52b in FIG. 5, is conducted through the left longitudinally extending section 18b and flows through the bend section 48b of the connector section 22b, in a manner indicated schematically by arrows 54b, 56b and 58b in FIG. 5. The electrical current flows away from the connector section 22b through the right longitudinally extending section 20b in the manner indicated by an arrow 62b in FIG. 3.

The left and right longitudinally extending sections 18b and 20b have parallel central axes 76b and 78b. Both of the axes 76b and 78b are disposed in a plane which extends perpendicular to the major side surfaces 30b, 32b, 34b, and 36b of the left and right longitudinally extending sections 18b and 20b. A central axis 82b of the connector section 22b extends parallel to and is spaced equal distances from the central axes 76b and 78b of the longitudinally extending sections 18b and 20b of the conductor 12b. The axis 82b extends through the center of curvature of the bend section 38b.

In accordance with the embodiment of the invention illustrated in FIG. 5, to promote the concentration of magnetic flux at the inside of the bend section 48b, a one-piece magnetic member 110 (FIG. 5) is positioned in the bend section 48b and extends around the outside of the bend section. The magnetic member 110 concentrates magnetic flux emanating from the current flowing through the connector section 22b. Thus, magnetic flux is concentrated between circular end surfaces 112 and 114 on the magnetic member 110. The end surfaces 112 and 114 have centers which are disposed on the central axis 82b of the connector section 22b.

The one-piece magnetic member 110 has end sections 116 and 118 on which the end surfaces 112 and 114 are disposed. An opening 26b is formed in the connector section 22b and extends completely through the connector section. The end surfaces 112 and 114 on the end sections 116 and 118 of the magnetic member 110 are aligned with opposite sides of the opening 26b.

A magnetic flux sensor, corresponding to the magnetic flux sensor 14 of FIG. 2, may be positioned in the opening 26b in the same manner as previously explained in conjunction with the embodiment of the invention illustrated in FIGS. 1 and 2. The magnetic flux sensor would have the same construction as the magnetic flux sensor 14 of FIG. 2 and would include a magnetic flux responsive device, such as a Hall effect device, which is supported by a support structure, corresponding to the support structure 92 of FIG. 2. It should be understood that other known magnetic flux responsive devices could be utilized if desired.

The one-piece magnetic member 110 includes a cylindrical connector section 124 which is connected with the end sections 116 and 118 by arcuate bend sections 126 and 128. The connector section 124 has a central axis 132 which extends parallel to the central axis 82b of the connector section 22b. The axes 132 and 82b are disposed in a plane which extends parallel to the major side surfaces 30b, 32b, 34b, and 36b of the left and right longitudinally extending sections 18b and 20b of the conductor 12b.

The one-piece magnetic member 110 concentrates magnetic flux at the opening 26b in the connector section 22b. The magnetic flux sensor (not shown in FIG. 5 but similar to the magnetic flux sensor 14 in FIG. 2), includes a magnetic flux responsive device which is positioned on the axis 82b. The bend section 48b cooperates with the end sections 116 and 118 of the magnetic member 110 to concentrate magnetic flux at the opening 26b where the magnetic flux sensor is located. The connector section 124 of the one-piece magnetic member 110 promotes the flow of magnetic flux between the end sections 116 and 118.

In view of the foregoing description, it is apparent that the present invention provides an electrical current sensing apparatus 10 (FIGS. 1–4) which includes an electrical current conductor 12 having a connector section 22 which extends between longitudinally extending sections 18 and 20 of the conductor. A magnetic flux sensor 14 is disposed adjacent to the connector section 22. The magnetic flux sensor 14 may include a support 92 formed of electrically insulating material and a magnetic flux responsive device, such as a Hall effect device 94.

The connector section 22 may have a central axis 82 which extends parallel to central axes 76 and 78 of the longitudinally extending sections 18 and 20 of the conductor 12. The Hall effect device 94 may have a flux sensitive surface 96 which extends perpendicular to the central axis 82 of the connector section 22. In one embodiment of the invention, the magnetic flux sensor 14 is at least partially disposed in an opening 26 formed in the connector section 22 of the conductor. In another embodiment of the invention, the magnetic flux sensor 14 is disposed in engagement with an inner surface 104 of the connector section.

Having described the invention, the following is claimed:

1. An electrical current sensing apparatus comprising an electrical current conductor having first and second longitudinally extending sections which conduct electrical current and a connector section extending between said first and second longitudinally extending sections, said connector section includes a bend portion, a first side portion which extends between said bend portion and said first longitudinally extending section, a second side portion which extends between said bend portion and said second longitudinally extending section, and surface means for defining a continuous slot which extends from said first side portion across said bend portion to said second side portion, said arcuate bend portion being effective to conduct all of the electrical current which is conducted by said first and second longitudinally extending sections, and a magnetic flux sensor which is at least partially disposed in said slot in said bend portion of said connector section.

2. An apparatus as set forth in claim 1 wherein said magnetic flux sensor includes an electrically insulating support which is at least partially disposed in a portion of said slot which extends through said bend portion of said connector section and a Hall effect device which is supported by said support and has a flux sensitive side surface which extends transverse to a central axis of said connector section, said Hall effect device having an output which is a function of the electrical current conducted through said conductor.

3. An apparatus as set forth in claim 2 further including first and second conductor members formed of an electrically conductive material and at least partially enclosed by said connector section, said first conductor member extends in a first direction from said slot along an inner side surface of said bend portion and said second conductor member extends in a second direction from said slot along the inner side surface of said bend portion, said Hall effect device being disposed between an end portion of said first conductor member and an end portion of said second conductor member.

4. An apparatus as set forth in claim 3 wherein said first and second conductor members have central axes which extend through said Hall effect device.

5. An apparatus as set forth in claim 1 further including a magnetic member having first and second end sections which are at least partially enclosed by said connector section of said conductor and an intermediate section which is disposed outside of said connector section and extends across the slot in said connector section, said first end section of said magnetic member extends in a first direction from said slot along an inner side surface of said bend portion and said second section of said magnetic member extends in a second direction from said slot along the inner side surface of said bend portion.

6. An apparatus as set forth in claim 1 wherein said first and second longitudinally extending sections extend in opposite directions from said connector section.

7. An apparatus as set forth in claim 1 wherein said connector section extends transverse to and is connected with an end portion of said first longitudinally extending section and extends transverse to and is connected with an end portion of said second longitudinally extending section.

8. An apparatus as set forth in claim 1 wherein said continuous slot in said connector section includes a first linear portion disposed in said first side portion of said connector section, a second linear portion disposed in said second side portion of said connector section, and an arcuate portion which extends across said bend portion of said connector section.

9. An apparatus as set forth in claim 1 wherein said first and second longitudinally extending sections have parallel central axes which extend parallel to the central axis of said connector section.

* * * * *